United States Patent [19]
Galburt et al.

[11] Patent Number: 4,907,035
[45] Date of Patent: Mar. 6, 1990

[54] UNIVERSAL EDGED-BASED WAFER ALIGNMENT APPARATUS

[75] Inventors: Daniel N. Galburt, Norwalk; Jere D. Buckley, Wilton, both of Conn.

[73] Assignee: The Perkin-Elmer Corporation, Norwalk, Conn.

[21] Appl. No.: 842,145

[22] Filed: Mar. 21, 1986

Related U.S. Application Data

[63] Continuation of Ser. No. 595,188, Mar. 30, 1984, abandoned.

[51] Int. Cl.$^4$ .............................................. G01B 11/00
[52] U.S. Cl. ...................................... 356/150; 356/400
[58] Field of Search ............... 356/372, 373, 375, 376, 356/399, 400, 426, 150

[56] References Cited

U.S. PATENT DOCUMENTS

| 3,604,940 | 9/1971 | Matthews | 356/426 |
| 3,826,576 | 7/1974 | Stewart | 356/384 |
| 4,021,119 | 5/1977 | Stauffer | 356/386 |
| 4,328,553 | 4/1982 | Fredriksen et al. | 356/400 |
| 4,402,613 | 9/1983 | Daly et al. | 356/426 |
| 4,425,075 | 1/1984 | Quinn | 414/755 |
| 4,457,664 | 7/1984 | Judell et al. | 414/779 |
| 4,676,648 | 6/1987 | Schulz et al. | 356/385 |

FOREIGN PATENT DOCUMENTS 0053703 3/1983 Japan .................................. 356/375

Primary Examiner—Richard A. Rosenberger
Attorney, Agent, or Firm—Thomas P. Murphy; Paul A. Fattibene; Edwin T. Grimes

[57] ABSTRACT

An apparatus for aligning a wafer. The edge of a wafer is mapped by means of a photodetector array and a light source to provide a signal representative of the X-Y position and angular orientation of the wafer as the wafer is rotated one revolution on a shaft. The signal is digitized and processed to provide stored information of the X-Y position and angular orientation of the wafer. The shaft is then rotated to move the wafer from its calculated angular orientation to a desired angular orientation. The X-Y positional information may be used to center the wafer.

5 Claims, 1 Drawing Sheet

UNIVERSAL EDGED-BASED WAFER ALIGNMENT APPARATUS

This application is a continuation, division, of application Ser. No. 595,188, filed Mar. 30, 1984 now abandoned.

BACKGROUND OF THE INVENTION

In the fabrication of integrated circuits it is necessary to prealign the silicon wafers prior to delivery to the work station. At the work station the wafer is then fine aligned prior to a circuit pattern being imprinted thereon. Prealignment is important inasmuch as the the wafer must be accurately enough positioned to be within the range of the fine alignment mechanism.

Presently available prealigners have the requirement that the wafer be centered, i.e., positioned in the X-Y direction before it can be angularly oriented. This is so inasmuch as the wafer can be delivered to the prealigner stage off-center by as much as half an inch which places it out of the range of any presently available angular orientation scheme.

The present invention overcomes the above problem and provides an accurate prealigner wherein the wafer may be angularly oriented without the necessity of first centering the wafer in the X-Y direction. In other words, the present invention is a prealigner which can angularly orient a wafer without the requirement of a integral X-Y centering stage.

BRIEF DESCRIPTION OF THE INVENTION

The present invention comprises a shaft, means to rotate the shaft, vacuum means associated with the shaft for holding a wafer during rotation of the shaft. A light source and photo sensitive device are disposed on opposite sides of the wafer. As the wafer is rotated through one full revolution, the sensor detects the edge of the wafer to provide a signal representative of the eccentricitly, i.e., distance of the wafer from center in the X-Y direction. The signal also provides an indication of the angular position of the wafer by sensing the flat or notch of the wafer. The type of sensor used has a linear dimension which assures the shadow produced by the light source with the edge of the wafer is within the field of view of the sensor. The signal provided by the sensor is provided to a computer where it is used to calculate the X-Y position and angular orientation of the wafer.

Since the angular orientation of the wafer is known, the shaft is then rotated to orient the wafer to the desired angular orientation. The information representative of the X-Y position of the wafer may be used to center the wafer when it is transferred to the next stage.

DESCRIPTION

Figure 1:
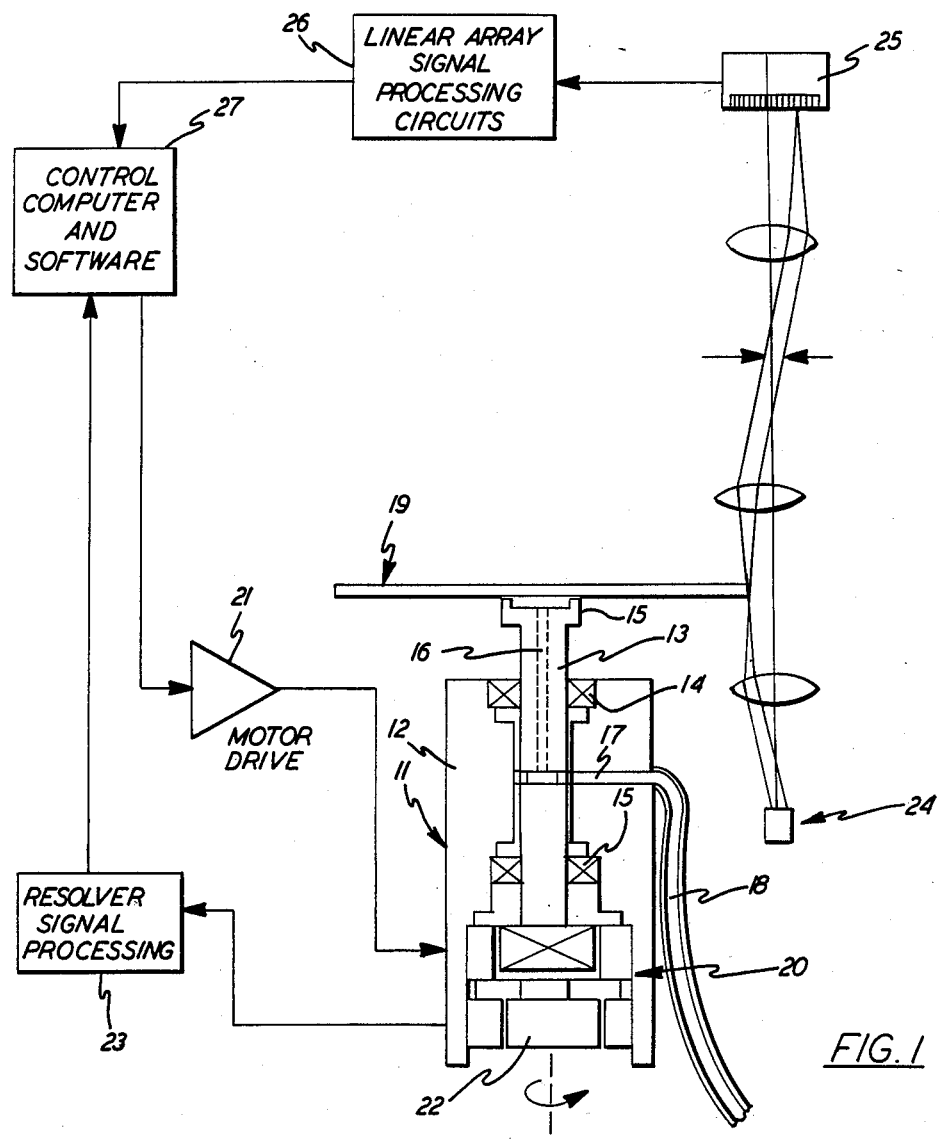
FIG. 1 is a block diagram, partly in schematic, of an embodiment of the present invention.

Referring to FIG. 1 there is shown the wafer prealignment apparatus of the present invention. It comprises a shaft assembly 11. The shaft assembly 11 comprises a housing 12. A shaft 13 is rotatively mounted within housing 12 with the aid of conventional bearings 14. One end of the shaft 13 comprises a cup-shaped element 15. The shaft 13 has a conduit 16 formed therein which communicates with a tube 18 via conduit 17 formed in housing 12. Thus, a wafer 19 transferred to element 15 may be secured thereto by vacuum applied to the center of cup-shaped element 15 via conduits 16 and 17 and tube 18.

A servo motor 20 is disposed at the other end of shaft 13 and is used to rotate the shaft 13 when energized by motor drive 21. Also disposed at the other end of shaft 13 is a resolver 22 which provides a signal representative of the angular orientation of the shaft 13. This signal is provided to signal processor 23 where it is digitized into a precise number for discrete angular positions of the shaft 13, i.e., a number identifying the angular position of the shaft 13 for each 10 to 20 arcseconds position of the shaft is determined and provided as input to computer 27. Such a resolver and processing electronics are well known commercially available items.

On one side of the wafer 19 is a light source 24 which may be a light emitting diode, a laser diode or any other convenient source of light. On the other side of the wafer 19 located substantially in the path of the light beam from light source 24 is a light sensor 25 which may be a charge coupled device array. The light source 24 and light sensor 25 are disposed at the approximate expected position of the edge of the wafer 19 so that the light source 24 casts the shadow of the edge of the wafer 19 either directly onto the light sensor 25 or indirectly thru imaging optics.

The light sensor 25 is chosen to have a length so that it captures the edge shadow of the wafer 19 over a wide range of eccentricity, e.g., the wafer 19 may be half an inch or more off center when it is delivered to the shaft 13. One such sensor is a charge coupled device array manufactured by Texas Instruments, e.g., the TC103. Such a charge coupled device has a sensitive length of an inch or more and comprises two thousand or more individual elements. It is, therefore, capable of accommodating large variations, for example, half an inch or more variation in eccentricity, i.e., the amount that the wafer is off-center when it is delivered to the prealignment stage.

The series of lenses shown disposed between the light source 24 and the wafer 19 direct light on a radial line across the wafers edge. Optional lenses between the wafer and light sensor provide telecentric imaging of the light beam onto the light sensor. This provides a substantially collimated beam of light onto the sensitive area so that the shadow of the edge which is cast upon the sensitive surface of the light sensor 25 is sharply defined. Other lens arrangements may be used to accomplish this purpose.

As the shaft turns, the light sensor 25 is periodically electronically scanned producing an analog output signal.

The analog output signal of the light sensor 25 is provided to the linear array signal processing circuit 26 where it is digitized and reduced to a series of numbers each representative of the wafer edge position at a given shaft angle which is provided as an input to computer 27.

The digitized information from linear array signal processor 26 is provided to computer 27 which may be the Intel 8088 available from the Intel Corporation.

The digitized linear output and relevant resolver shaft angle data is stored in the computer 27 until the revolution of the wafer is complete. The computer 27 then has sufficient information to calculate the X-Y position and angular orientation of the wafer.

Since the desired angular orientation of the wafer 19 is a known quantity and may be permanently stored in the computer, motor drive 21 may be energized to rotate the wafer to the desired angular orientation.

Since the eccentricity or deviation in the X-Y position from center has also been calculated by the computer 27, this information may be supplied to an X-Y stage to position it to cause the wafer to be centered when it is transferred to it. As aforesaid, the use of a light sensor capable of capturing a wafer edge over a wide range of eccentricity eliminates the need for an integral X-Y stage and provides a universal wafer prealigner which is hardware independent of the wafer geometry. Since in a typical system the wafer is transferred to a prealigner at an unknown angle and up to half an inch off center, the present invention provides a method for accurately aligning the wafer in angular orientation without first centering the wafer.

Figure 2:
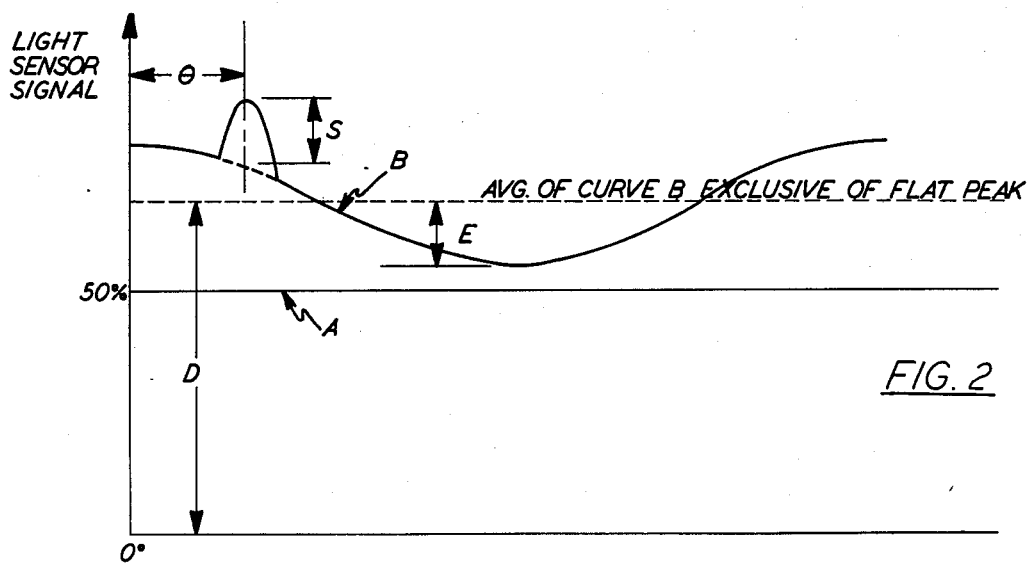
FIG. 2 is a graphical representation useful in understanding the present invention.

FIG. 2 is an illustration of the signal resulting from an edge scan of the wafer 19 by light sensor 25.

Curve A represents the signal from light sensor 25 of a wafer which happened to be transferred to shaft 13 in an accurately centered condition, i.e., with no eccentricity and which has no flat or notch.

Curve B on the other hand represents the signal when the wafer is off center and has a notch or flat. This curve approaches a sinusoid the amplitude of which at various points along the curve is representative of the eccentricity or off-center condition of the wafer at various angles as the wafer is rotated. The deviation S in the signal indicates the position of the flat or notch in the wafer and, therefore, its angular orientation.

On the curve B, the value 0 indicates the flat or notch angular location. D is a measure of the wafer's diameter. E is a measure of the eccentricity of the wafer and S is a measure of the flat or notch depth which in conjunction with diameter D determines flat or notch width. Thus, it may be seen that the signal from the light sensor 25 provides sufficient information to determine the angular position of the wafer. Since desired position of the wafer is also known, the wafer may be easily positioned to the desired angular position.

Since the signal from light sensor 25 also contains deviations of the wafer from center, this information may be used to pre-position the stage to which the wafer is transferred so that on transfer the wafer is centered thereon.

Other modifications of the present invention are possible in light of the foregoing description which should not be construed as placing limitations on the invention beyond those set forth in the claims which follow:

What is claimed is:

1. A universal wafer prealigner comprising:
   a shaft;
   first means for securing a wafer eccentrically to one end of said shaft, said wafer having a flat;
   second means for rotating said shaft,
   light sensor means, on one side of said wafer, for sensing the shadow of the edge of said wafer;
   single light source means, on the other side of said wafer, for directing a single light beam parallel to the axis of rotation of said wafer partially on one side of said wafer and partially on said light sensor;
   said light sensor means having a linear dimension sufficiently long to capture the shadow of said edge of said wafer;
   said light sensor means providing an output signal as said second means rotates said shaft, said output signal being indicative of the angular position of said flat, the degree of eccentricity of said wafer with respect to said shaft, and the angular relationship between said flat and the eccentricity of said wafer with respect to said shaft;
   said shaft including resolver means, connected to the other end thereof, for providing signals representative of the angular position of said shaft at predetermined increments;
   computer means for storing data representative of a desired X-Y and angular positions of said wafer;
   means connecting said signals from said resolver means and said sensor means to said computer means, for calculating deviation of said wafer from said desired X-Y and angular positions of said wafer;
   motor drive means, connected between said computer means and said second means, for positioning said wafer to said desired angular position.

2. A universal wafer prealigner as claimed in claim 1 wherein said output signal comprises:
   a sinusoid waveform having a deviation therefrom;
   said deviation being indicative of the angular position of said flat;
   the average of the sinusoid waveform, exclusive of the deviation, being indicative of the wafer diameter;
   the difference between the average of the sinusoid waveform and a peak or trough of the sinusoid waveform being indicative of the location and magnitude of the eccentricity of said wafer; and
   the extent of deviation from said sinusoid being indicative of the depth of the flat.

3. A universal wafer prealigner as claimed in claim 1, wherein said light sensor means comprising a charge coupled device array is disposed relative to said light source means and edge of said wafer to capture the shadow of said edge of said wafer when said wafer is substantially half an inch off center on said shaft.

4. A wafer prealigner according to claim 3 further comprising:
   third means connected to said charge coupled device array providing a digitized output of the signal therefrom.

5. A method of aligning a wafer comprising the steps of:
   placing a wafer eccentrically on a shaft;
   rotating said shaft;
   directing a single light beam substantially parallel to the axis of rotation of said shaft partially illuminating the edge of said wafer;
   detecting the portion of said light beam not illuminating said wafer over a period of at least one revolution of said shaft;
   generating signals representative of the motion of said wafer; and
   calculating the x-y and angular position of said wafer from said signals.

* * * * *